(12) United States Patent
Angerer et al.

(10) Patent No.: US 11,208,311 B2
(45) Date of Patent: Dec. 28, 2021

(54) DEVICE FOR INFLUENCING THE VOLUME FLOW OF A FILLING PRODUCT IN A FILLING SYSTEM

(71) Applicant: KRONES AG, Neutraubling (DE)

(72) Inventors: Florian Angerer, Neutraubling (DE); Josef Doblinger, Neutraubling (DE)

(73) Assignee: KRONES AG, Neutraubling (DE)

( * ) Notice: Subject to any disclaimer, the term of this patent is extended or adjusted under 35 U.S.C. 154(b) by 346 days.

(21) Appl. No.: 16/306,869

(22) PCT Filed: Sep. 29, 2017

(86) PCT No.: PCT/EP2017/074768
§ 371 (c)(1),
(2) Date: Mar. 5, 2019

(87) PCT Pub. No.: WO2018/060419
PCT Pub. Date: Apr. 5, 2018

(65) Prior Publication Data
US 2021/0147207 A1    May 20, 2021

(30) Foreign Application Priority Data
Sep. 29, 2016    (DE) .................... 10 2016 118 474.8

(51) Int. Cl.
*B67C 3/28*    (2006.01)
*B67C 3/00*    (2006.01)
(Continued)

(52) U.S. Cl.
CPC .............. *B67C 3/286* (2013.01); *B67C 3/007* (2013.01); *F16K 49/00* (2013.01);
(Continued)

(58) Field of Classification Search
CPC ......... B67C 3/286; B67C 3/007; F16K 49/00; F16K 49/005; H05K 7/20; H05K 7/20136; H05K 7/20409
(Continued)

(56) References Cited

U.S. PATENT DOCUMENTS 3,926,169 A * 12/1975 Leshner ................. F02M 57/06
                                                        123/297
5,501,253 A *  3/1996 Weiss ..................... B67C 3/2614
                                                         141/40
(Continued)

FOREIGN PATENT DOCUMENTS

CN            1681549       10/2005
CN          202510817       10/2012
(Continued)

OTHER PUBLICATIONS

Office Action, Chinese Application No. 201780059039.2, dated Jun. 18, 2020, 9 pages.
(Continued)

*Primary Examiner* — Timothy L Maust
(74) *Attorney, Agent, or Firm* — Haynes and Boone, LLP (57) ABSTRACT

A device for influencing the volume flow of a filling product in a filling plant for filling with filling products includes a valve body with a valve seat and a valve cone which can be displaced relative to the valve seat, an actuator for positioning the valve cone relative to the valve seat, an electronic controller for controlling the actuator, and a housing which is directly connected to the valve body and in which the actuator and the electronic controller are disposed. An arrangement for reducing a heat input into the electronic controller is provided.

20 Claims, 4 Drawing Sheets

(51) Int. Cl.
*F16K 49/00* (2006.01)
*H05K 7/20* (2006.01)
(52) U.S. Cl.
CPC ..... *H05K 7/20136* (2013.01); *H05K 7/20409* (2013.01); *F16K 49/005* (2013.01); *H05K 7/20* (2013.01)
(58) Field of Classification Search
USPC ............................................ 141/57; 222/537
See application file for complete search history.

(56) References Cited

U.S. PATENT DOCUMENTS

| | | | | |
|---|---|---|---|---|
| 5,727,606 | A * | 3/1998 | Weiss .................. | B67C 3/2631 141/198 |
| 6,079,460 | A * | 6/2000 | Ballan .................. | B67C 3/005 141/145 |
| 6,189,578 | B1 * | 2/2001 | Clusserath ............ | B67C 3/10 141/293 |
| 6,427,970 | B1 * | 8/2002 | Silva ................... | F15B 13/0402 137/338 |
| 6,543,481 | B2 * | 4/2003 | Neff .................... | F15B 13/0403 137/625.63 |
| 7,104,743 | B2 * | 9/2006 | Rainville ............. | B65G 53/24 141/302 |
| 7,353,848 | B2 * | 4/2008 | Krulitsch ............. | B67C 3/06 141/146 |
| 7,469,726 | B2 * | 12/2008 | Clusserath ............ | B67C 3/04 141/57 |
| 8,714,209 | B2 * | 5/2014 | Hartel ................. | B67C 3/281 141/48 |
| 9,010,381 | B2 * | 4/2015 | Clusserath ............ | B67C 3/10 141/6 |
| 2002/0134438 | A1 | 9/2002 | Vilagines et al. | |
| 2006/0283518 | A1 * | 12/2006 | Ricker ................. | B67C 3/2611 141/39 |
| 2009/0078334 | A1 * | 3/2009 | Nufer ................... | B65B 1/36 141/83 |
| 2011/0303324 | A1 * | 12/2011 | Mauro .................. | B67C 3/281 141/98 |
| 2016/0016774 | A1 * | 1/2016 | Clusserath ............ | B67C 3/225 141/7 |

FOREIGN PATENT DOCUMENTS

| | | | |
|---|---|---|---|
| CN | 203594871 | | 5/2014 |
| CN | 205013844 | | 2/2016 |
| CN | 105501484 | | 4/2016 |
| CN | 105593587 | | 5/2016 |
| DE | 19850188 | | 5/1999 |
| EP | 3006392 | | 4/2016 |
| GB | 1005748 | * 9/1965 | ........... G05D 23/125 |
| JP | H11223270 A | | 8/1999 |
| WO | WO 01/62059 | | 8/2001 |
| WO | WO 2007/012402 | | 2/2007 |
| WO | WO 2009/004501 | | 1/2009 |
| WO | WO 2014/009362 | | 1/2014 |

OTHER PUBLICATIONS

International Search Report and Written Opinion issued in International Patent Application No. PCT/EP2017/074768 dated Jan. 19, 2018.

First Office Action dated Sep. 7, 2021 from corresponding Japanese application No. 2018-563623, 4 pages.

* cited by examiner

DEVICE FOR INFLUENCING THE VOLUME FLOW OF A FILLING PRODUCT IN A FILLING SYSTEM

CROSS REFERENCE TO RELATED APPLICATIONS

This application is a national stage of International Application No. PCT/EP2017/074768, filed Sep. 29, 2017, which claims priority from German Patent Application No. 10 2016 118 474.8 filed on Sep. 29, 2016 in the German Patent and Trademark Office, the disclosures of which are incorporated herein by reference in their entirety.

BACKGROUND

Technical Field

The present invention relates to a device for influencing the volume flow of a filling product in a filling plant for filling a container with a filling product, for example for influencing the volume flow of the beverage that is to filled when filling a beverage container with the beverage in a beverage filling plant.

Related Art

In beverage filling plants, it is known to influence, and in particular to control or regulate, the volume flow of filling product that flows from a filling product reservoir to the actual filling valve. For this purpose, throttle valves are known, which are disposed in the path of the filling product between the filling product reservoir and the filling product outlet, and which enable the volume flow to be influenced.

From WO 2014/009362 A2, a valve is for example known which can be designed as a proportional valve and by means of which the volume flow of the filling product can be influenced. In this case, it is not only possible to switch between two differing volume flows, i.e. between a first volume flow in which the valve is fully open, and a second volume flow in which the valve is fully closed, but also possible by means of the proportional valve to adjust the flow to various differing volume flows, or any number of differing volume flows, according to the positioning of the valve cone relative to its valve seat. For this purpose, the said proportional valve is provided with an actuator, by means of which the valve cone can be displaced to differing positions with respect to the valve seat, and in this manner the valve can be adjusted to supply differing volume flows.

In order to provide a reproducible volume flow in the filling device by means of the proportional valve, an electronic controller is provided, by means of which the actuator can be operated, and which also serves to ensure that a volume flow required by a central control system is actually supplied by each individual proportional valve.

In a beverage filling plant, a plurality of filling points are usually provided, and such a proportional valve is disposed upstream of each of these filling points, in order that the volume flow which eventually flows into each of the containers that are to be filled can be controlled according to the requirements of a central filling control system in each case.

With the aim of providing the proportional valve with a compact design, the actuator and the electronic controller are arranged in a housing that is directly connected with the valve body. In this manner, the proportional valve can be disposed in the beverage filling plant as a compact unit.

Due to the arrangement of the electronic controller and the actuator in a housing that directly adjoins the valve body, however, such a compact proportional valve can be used only in beverage filling plants that are intended for cold filling. This is because if too much heat enters the electronic controller this can have a negative influence on the functionality and durability of the electronic controller. It has therefore become necessary, in known devices in filling plants in which it is intended to carry out the filling process at high temperatures, to accommodate the electronic controller in a separate electronics enclosure. This is in order to provide thermal decoupling of the hot valve body and the electronic controller. Thus it has not been possible to achieve in this manner a compact design of the proportional valves and thereby of the beverage filling plant as a whole.

SUMMARY

A compact device for influencing the volume flow of a filling product, which can also be used in a hot-fill process is described according to various embodiments.

Accordingly, a device for influencing the volume flow of a filling product in a filling plant for filling with filling products is proposed, that includes a valve body with a valve seat and a valve cone which can be displaced relative to the valve seat, an actuator for positioning the valve cone relative to the valve seat, an electronic controller for controlling the actuator, and a housing which is directly connected to the valve body and in which the actuator and the electronic controller are disposed. An arrangement for reducing a heat input into the electronic controller is provided.

Due to the fact that the arrangement for reducing the heat input into the electronic controller is provided, the device for influencing the volume flow of the filling product, which already has a compact design due to the accommodation of the electronic controller in the housing, and which therefore can dispense with the provision of a central electronics enclosure for accommodating the electronic controller for the plant as a whole, can also be used in hot-fill processes, since the heat input into the electronic controller is reduced, and in this manner negative effects on the electronic controller can be avoided.

The arrangement for reducing the heat input into the electronic controller primarily serves to reduce the heat input emanating from the heated valve body.

In other words, in this manner a device for influencing the volume flow can be provided in a compact form, and at the same time an absence of sensitivity to heat can be achieved, so that the arrangement for influencing the volume flow, for instance a proportional valve, can be particularly flexibly deployed in filling plants for filling products.

By means of the arrangement for reducing the heat input into the electronic controller, it is further possible to clean and/or sterilize the device for influencing the volume flow using high temperature sterilization processes and high temperature cleaning processes. The device can thus be used with all common filling processes and all common cleaning and sterilization processes, while nevertheless providing at the same time a particularly compact design.

The arrangement for reducing the heat input advantageously includes cooling ribs, which are formed at an end of the valve body which faces towards the housing. Accordingly, it is possible to reduce a flow, in the direction of the housing, of heat which is input into the valve body by the filling product or a sterilization medium. A reduction in a flow of heat from the valve body into the housing can be achieved in that a portion of the heat that is input via the filling product or the sterilization medium into the valve body is emitted into the environment via the cooling ribs, and thus the flow of heat from the valve body to the housing is reduced. The reduction occurs firstly in that heat is emitted to the environment via the cooling ribs, and secondly in that, because cooling ribs are provided, the total volume of material that could contribute in any case to the transport of heat from the valve body to the housing is reduced.

The cooling ribs in the valve body can either be disposed in the valve body itself, which also defines the valve seat and in which the valve cone is accommodated, or can be provided in an extension of the valve body, which can also be provided as a separate element of the valve body which is, however, fixedly connected with the valve body.

The cooling ribs are generally formed in a hygienic design. Thus the cooling ribs have no indentations, seams or hard edges which could enable the accumulation of foreign material. The design of the cooling ribs typically also provides them with a shape that allows foreign material to be rinsed off or removed easily with a cleaning medium during the cleaning of the filling device.

In an advantageous embodiment, the arrangement for reducing the heat input includes a pneumatic air supply line for introducing pneumatic air into the housing. In certain embodiments, the pneumatic air which is in any case provided in a filling device as a working medium is here used to transport away the heat in the housing.

In several embodiments, the pneumatic air supply line has an expansion valve, a throttle valve or an aperture with a reduced cross section for feeding expanded pneumatic air into the housing.

In this manner, the dried and pressurized pneumatic air is generally expanded when it enters the housing via the expansion valve, the throttle valve or the aperture with a reduced cross section, so that it is cooled due to the Joule-Thomson effect, and this provides additional cooling to reduce the heat input into the electronic controller.

In one embodiment, the pneumatic air not only flows through the entire interior of the housing, but it is also specifically targeted to impinge on the electronic controller immediately after its expansion in the housing, so that the electronic controller is cooled before the pneumatic air, which is still cool, passes through the rest of the housing.

Accordingly, the housing and the pneumatic air supply line are geometrically arranged such that the routing of the airflow within the housing ensures that the expanded, and thus cold and dry, pneumatic air first impinges upon the electronic controller and/or other temperature-sensitive components inside the housing, and then flows through the remainder of the housing, leaving the housing via an air outlet.

In this case the pneumatic air is typically conducted out of the housing via defined channels, wherein it is ensured by means of an outlet valve or non-return valve that moisture and foreign bodies cannot enter the housing in an uncontrolled manner when the pneumatic air supply is switched off.

In various embodiments, the supply of pneumatic air via the pneumatic air supply line is regulated or controlled by means of a control valve, with the aid of a temperature sensor which is provided in the housing. It is also possible, as an alternative, to provide a constant supply of pneumatic air.

In some embodiments, the pneumatic air that is introduced into the housing is conducted from the housing through the valve body, in particular through the actuator, through a bellows that insulates the tappet of the valve cone against the filling product, and then via a defined outlet into the environment. The pneumatic air thus does not come into contact with the filling product, but nevertheless both serves to reduce the input of heat into the housing, and in particular into the electronic controller, and also leads to a cooling of the actuator by flowing through the actuator.

In an advantageous embodiment, a valve block is disposed on the housing, and generally the actuator of the valve, for example the actuator of a pilot valve, is accommodated in the housing.

In this manner a valve block, in particular a valve block with pilot valves for the additional control of upstream or downstream processes in the filling plant, can be designed in combination with the arrangement for influencing the volume flow in a compact manner. The pilot valves and/or the drives of the pilot valves can also be accommodated by the housing, so that the drives of the pilot valves can also profit from the arrangement for reducing the heat input into the electronic controller.

In order to achieve a compact design, the housing can have on one side, instead of a panel which closes it, an open flange on which the valve block can be mounted. A seal is typically provided between the valve block and the housing. It is also possible, however, for the valve block to be welded to the housing in order to be integrated in the housing.

In this embodiment too, the valve blocks and at least their drives are generally accommodated in the housing, in order to profit from the arrangement for reducing the heat input into the electronic controller.

A particularly advantageous embodiment results if the valve block is designed such that the used pneumatic air from the valves, for example the pilot valves, is conducted into the housing. In other words, the pilot valves also vent into the housing, so that when a full switching cycle for filling a container with a filling product is completed, and the valves and pilot valves have correspondingly gone through a full switching cycle, a flow of pneumatic air through the housing can be provided by the venting of the pneumatic system. This serves to reduce the heat input into the electronic controller.

In this manner it is possible for the pneumatic air that has already been used, and would otherwise be discharged, to be reused to reduce the heat input into the electronic controller. It is thereby possible to dispense with a separate supply of pneumatic air for reducing the heat input into the electronic controller, or else it is possible to reduce the flow of pneumatic air for reducing the heat input into the electronic controller, with the result that in this manner the overall consumption of pneumatic air can be reduced, while at the same time the device has a highly compact design and the durability and functionality of the electronic controller is ensured.

In order to continue to provide a compact design, and further to reduce the necessity for the electronics to be located in a central electronics enclosure of the filling plant, additional interfaces are generally also integrated in the housing, in order for example to connect flow meters, weighing cells or short-circuit sensors with the electronic controller, such that the device for influencing the volume flow can be regulated on the basis of the applicable sensor signals.

Thus for example, by means of the flow meter the position of the valve tappet can be regulated such that a particular predetermined volume flow is achieved. This can also be achieved by means of the signal from a weighing cell or the signal from a short-circuit sensor, wherein via the weighing cell it is possible to monitor the precise progress of the filling with filling product of the container that is to be filled, while via a short-circuit sensor it is possible only to monitor the reaching of a particular fill level, which can serve for example as the trigger for a reduction of the volume flow in the last portion of the filling process.

Thus the electronic components that were formerly disposed centrally can be substantially relocated to the individual device for influencing the volume flow, with the result that the device as a whole can have a more compact design and a reduced necessity for wiring.

BRIEF DESCRIPTION OF THE FIGURES

Further embodiments of the invention are more fully explained by the description below of the figures.

DETAILED DESCRIPTION

Examples of embodiments are described below with the aid of the figures. In the figures, elements which are identical or similar, or have identical effects, are designated with identical reference signs. In order to avoid redundancy, repeated description of these elements is in part dispensed with in the description below.

Figure 1:
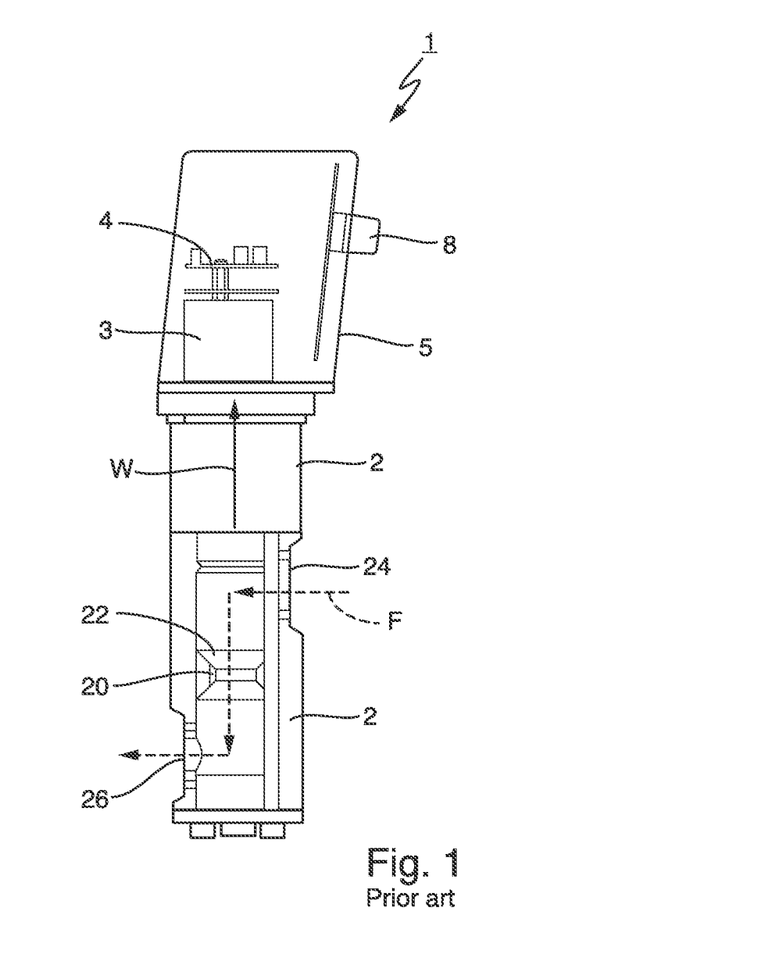
FIG. 1 is a schematic partially sectional side elevation of a proportional valve according to the prior art.

FIG. 1 shows a device 1 for influencing the volume flow of a filling product in a filling plant for filling with filling products according to the prior art, for example for filling with beverages in a beverage filling plant.

The device 1 includes a valve body 2 which defines a valve seat 20 that is in communication with an inlet 24 and an outlet 26 for the filling product. The valve body 2 accommodates a valve cone 22, which can be lowered into the valve seat 20 in a sealing or partially sealing manner and subsequently lifted out of the valve seat 20, so that the volume flow of the filling product, which enters the valve body 2 and the cavity that forms the valve seat 20 via the inlet 24, flows through the annular gap between the valve seat 20 and the valve cone 22 and then leaves the valve body 2 via the outlet 26. The flow path of the filling product through the device 1 is indicated schematically in FIG. 1 by the arrow F.

By means of the positioning of the valve cone 22 relative to the valve seat 20, the volume flow of the filling product that flows through the device 1 can be controlled or regulated. If, for example, the valve cone 22 is fully lifted out of the valve seat 20, the filling product flows without hindrance out of the outlet 26, and there is no restriction of the volume flow beyond the flow resistance that is in any case applied by the device 1. If it is desired to restrict the volume flow of the filling product, the valve cone 22 can be lowered to an appropriate degree in the direction of the valve seat 20, in order to reduce the annular gap between the valve cone 22 and the valve seat 20 and thereby achieve the desired reduced volume flow.

In order to achieve the appropriate positioning of the valve cone 22 relative to the valve seat 20, an actuator 3 is provided. This can for example be provided in the form of an electric motor or another electromechanical drive which is mechanically coupled with the valve cone 22, for example via a tappet, such that appropriate positioning of the valve cone 22 relative to the valve seat 20 can be achieved by operation of the actuator 3.

In order to control the actuator 3, an electronic controller 4 is provided, which enables the actuator 3 to be controlled on the basis of external control signals, on the basis of a logic provided by the electronic controller 4 itself, or on the basis of a combination of these two means. Depending on its design, the electronic controller 4 can process differing external control signals, evaluate and process sensor signals, and/or process feedback signals from the actuator 3, in order ultimately to achieve a positioning of the valve cone 22 relative to the valve seat 20, and thereby a volume flow, that is in accordance with the requirements of the filling process and/or the requirements of a central filling control system.

The actuator 3 and the electronic controller 4 are accommodated in a housing 5, which is directly connected with the valve body 2 and, according to the known embodiment, adjoins the valve body 2 in a sealing manner. By means of the accommodation of the actuator 3 and the electronic controller 4 in the housing 5, which is directly attached to the valve body 2, it is possible to enable a compact arrangement and a hygienically acceptable design of the device 1.

If a hot filling product were now to flow through the valve body 2 of this device from FIG. 1, which is designed according to the state of the art, there would be a flow of heat from the valve body 2 into the housing 5, so that an increased temperature would arise in the housing 5. In some circumstances this could have a negative influence on the functionality and durability of the electronic controller 4. The heat flow from the valve body 2 to the housing 5 is indicated schematically in FIG. 1 by the arrow W. The device 1 according to the state of the art from FIG. 1 cannot therefore be advantageously used in filling processes in which a hot filling product flows through the valve body 2.

Figure 2:
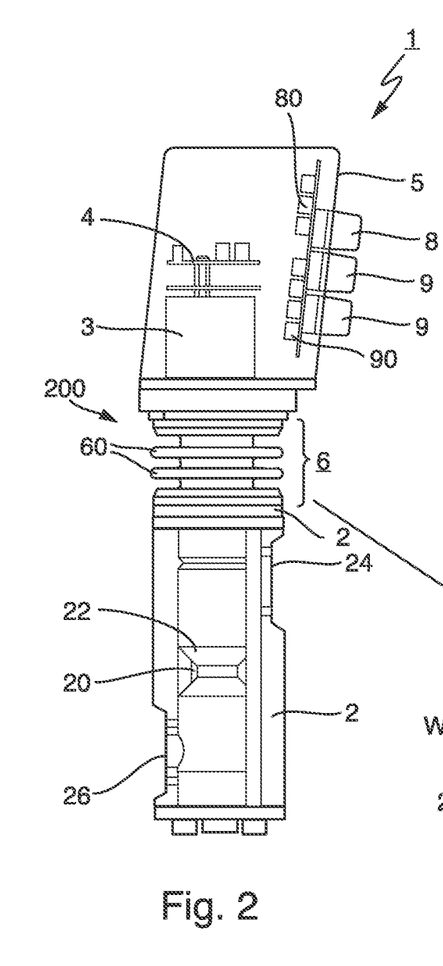
FIG. 2 is a schematic partially sectional side elevation of a device for influencing the volume flow of a filling product, with an arrangement for reducing the heat input into the electronic controller in the form of cooling ribs.

FIG. 2 shows a device 1 according to the present invention, in which the valve body 2 has an arrangement 6, in the form of cooling ribs 60, for reducing the heat input into the electronic controller 4. The arrangement 6 for reducing the heat input to the electronic controller 4 serves especially to reduce the input into the electronic controller 4 of heat originating from the valve body 2.

By means of the provision of the cooling ribs 60, when a hot filling product flows through the valve body 2 the flow of heat from the valve body 2 into the housing 5 is reduced. Accordingly, the heat input into the electronic controller 4 is also reduced.

The arrangement 6 for reducing the heat input into the electronic controller 4 thus enables the device 1 for influencing the volume flow also to be used for hot filling products. The device 1 can thereby now be used in all common filling processes, so that it is possible to achieve a compact design of a universally usable filling plant.

The arrangement 6 for reducing the heat input, in the form of the cooling ribs 60, is generally designed such that as great a portion as possible of the heat energy that flows from the valve body 2 in the direction of the housing 5 is radiated away by means of the cooling ribs 60, and thus does not flow into the housing 5. In the detail representation of the cooling ribs 60 in FIG. 3, the flow of the heat and the radiation of the heat energy due to the cooling ribs 60 are indicated schematically by the arrow W. The cooling ribs 60 are accordingly provided at the end 200 of the valve body 2 which is adjoined by the housing 5. Thus the cooling ribs 60 in effect provide a partial insulation between the valve body 2 and the housing 5.

Figure 3:
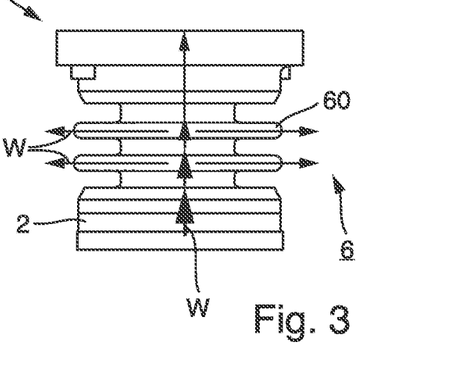
FIG. 3 is a view of a detail from FIG. 2, showing the structure of the cooling ribs.

As can be seen for example from the detail view in FIG. 3, the cooling ribs 60 are generally designed such as to avoid indentations and edges which could enable the accumulation of foreign material. In this manner a hygienic design can thus be provided. This is particularly important in the field of filling foodstuffs and beverages. The surfaces of the cooling ribs 60 are correspondingly smooth, and the design is rounded in character, such that foreign material cannot settle on it and can reliably and simply be rinsed off during a cleaning cycle.

In the housing 5, along with the actuator 3 and the actuators of the valve blocks 7 or the pilot valves 74, other electronic components 90 can be provided for evaluating sensor signals that are supplied via an additional sensor interface 9. It is further possible to provide communication modules 80 for connecting the device 1 to a higher-level controller, for example the plant control system. These components too can profit from the reduced heat input in the design, enabling at the same time a particularly compact structure of the device 1 and thereby of the filling plant as a whole.

In some embodiments, the sensor interface 9 is connected to a flow meter, by means of which the position of the valve cone 22 with respect to the valve seat 20 can be regulated in accordance with appropriate requirements for the volume flow. In a variant, a connection can also be provided to a weighing cell, by means of which it is possible to determine the volume flow flowing into the container that is to be filled, and consequently by means of which the position of the valve cone 22 with respect to the valve seat 20 can be regulated.

The sensor interface 9 can also be provided to connect a short-circuit sensor, which dips into the container that is to be filled in order to signal a certain filling threshold from which a change is to be made in the volume flow that is flowing into the container, for example towards the end of the filling process.

Figure 4:
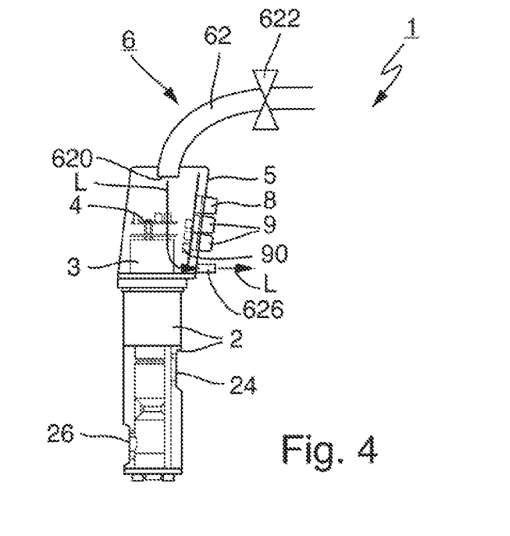
FIG. 4 is a schematic partially sectional side elevation of a further device for influencing the volume flow of a filling product, with an arrangement for reducing a heat input into the electronic controller in the form of a pneumatic air supply line.

In a further development of the device 1, as shown in FIG. 4, an arrangement 6 for reducing the heat input, in the form of a pneumatic air supply line 62, is provided on the housing 5. Via the pneumatic air supply line 62, pneumatic air, which is in any case provided as a working medium in a filling plant for filling with the filling product, can be introduced into the housing 5, and in this manner heat can be transported away, so that here too a reduction of the heat input into the electronic controller 4 is achieved.

In order to enable a constant flow of pneumatic air through the housing 5, in several embodiments, an air outlet 626 is provided, which is arranged such that the pneumatic air that is supplied via the pneumatic air supply line 62 passes through the housing 5 evenly, and generally also in accordance with the sensitivity to temperature of the individual components within the housing 5. The air outlet 626 is typically provided with a non-return valve to prevent the entry of foreign bodies and moisture into the housing 5 when the pneumatic air supply 62 is switched off. The airflow of the pneumatic air through the housing 5 and past the electronic controller 4 is indicated schematically in FIG. 4 by the arrow L.

The pneumatic air supply 62 into the housing 5 can generally be carried out via an expansion valve, a throttle valve or an aperture with a reduced cross section 620, such that an expansion takes place of the pressurized and dried pneumatic air that is supplied from the pneumatic system of the filling plant, and the pneumatic air is thus cooled when it enters the housing 5. Thus pneumatic air is not only supplied and passed through the housing 5 in order to transport heat away, but it also explicitly provides additional cooling at this point due to the Joule-Thomson effect, which also serves to reduce the heat input into the electronic controller 4.

The pneumatic air supply line 62, and in particular the orientation of the aperture with a reduced cross section 620, are chosen such that the pneumatic air which is expanded, dried and cooled by expansion first impinges on the components within the housing 5 that are especially temperature-sensitive, in particular the electronic controller 4, so that in this manner a cooling and thereby a reduction of the heat input into the electronic controller 4 is achieved.

Via a control valve 622, the supply of pneumatic air via the pneumatic air supply line 62 can be controlled or regulated. A constant amount of pneumatic air can be provided and passed through the housing 5, in order thereby to achieve the reduction in the heat input into the electronic controller 4, or else the amount of pneumatic air that is supplied can be controlled or regulated by means of a temperature sensor 624 that is provided in the housing 5. In this case, for example, when certain temperature threshold values are exceeded the supply of pneumatic air can be increased by means of the control valve 622, and when the temperature falls below certain temperature threshold values the supply of pneumatic air can be reduced. The temperature sensor 624 can generally also be provided on the circuit board of the electronic controller 4, in order to monitor the temperature of the electronic controller 4 directly.

By means of the control or regulation of the supply of pneumatic air, the consumption of pneumatic air can be optimized, and at the same time it can be ensured that the electronic controller 4 is constantly operated within an optimum temperature range, and the heat input into the electronic controller 4 is thereby reduced.

Figure 5:
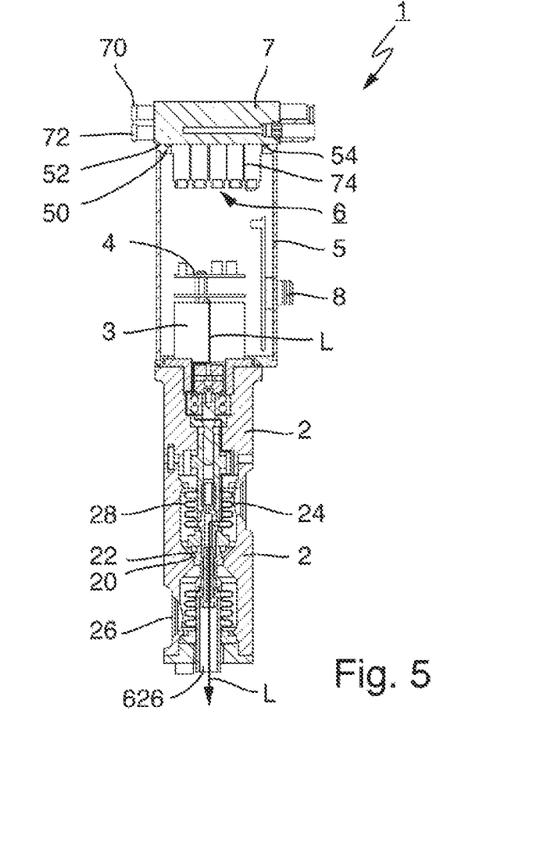
FIG. 5 is a schematic sectional view of a further arrangement for influencing the volume flow of a filling product, with an arrangement for reducing a heat input into the electronic controller in the form of a pneumatic air supply line, and with an integrated valve block.

FIG. 5 shows a schematic sectional representation of a device 1 in a further embodiment, in which the housing 5 is provided with a flange 52 on its upper side 50. A valve block 7 is disposed on the flange 52, typically with the use of a seal 54, and closes the housing 5 in the upwards direction. The valve block 7 can be screwed to the housing 5 by means of the flange 52, or instead welded directly to the housing 5.

Along with a pneumatic air intake 70 and a pneumatic air outlet 72, the valve block 7 includes several pilot valves 74. The pilot valves 74 are provided for switching differing pneumatic processes within the filling plant. Due to the superimposition of the valve block 7 on the top 50 of the housing 5, effectively as the upper "housing wall", and the screwed attachment of the flange 52, generally using a seal 54, the housing 5 can be sealed against the environment, and the pilot valves 74, or their drives, can protrude into the interior of the housing 5. This results in a highly compact design of the device 1 in combination with the valve block 7, and the pilot valves 74 and/or the drives of the pilot valves 74 can also profit from the reduced heat input due to the arrangement 6 for reducing the heat input into the electronic controller 4. In other words, the pilot valves 74, and/or their actuators, can also be cooled within the housing 5, while the design of the device 1 remains compact.

In various embodiments, the pilot valves 74 vent into the interior of the housing 5. The pneumatic air outlet 72 can also be conducted into the housing 5. In this manner, a reduction of the heat input into the electronic controller 4 can be achieved, in that the pneumatic air that is already being used in the valve block 7 is expanded into the housing 5, and in this manner brings about a reduction of the heat input for the components provided in the housing 5, and in particular for the electronic controller 4, and serves to transport away the heat energy. Due to the use of the exhaust air from the valve block 7, which is present in any case, it is possible to dispense with the use of additional pneumatic air.

The pneumatic air generally flows through the housing 5 and through the actuator 3, i.e. between the rotor and the stator of the actuator 3, and then through a bellows 28 which is provided for sealing the actuator 3 against the filling product, in order then to be conducted out of the device 1 via a screw that fixes the valve cone 22 and is designed as an air outlet 626. The air flow is indicated by the arrow L. Thus the pneumatic air flows not only through the interior of the housing 5, but also through the actuator 3 and parts of the valve body 2, in order in this manner to enable heat energy to be transported away.

Figure 6:
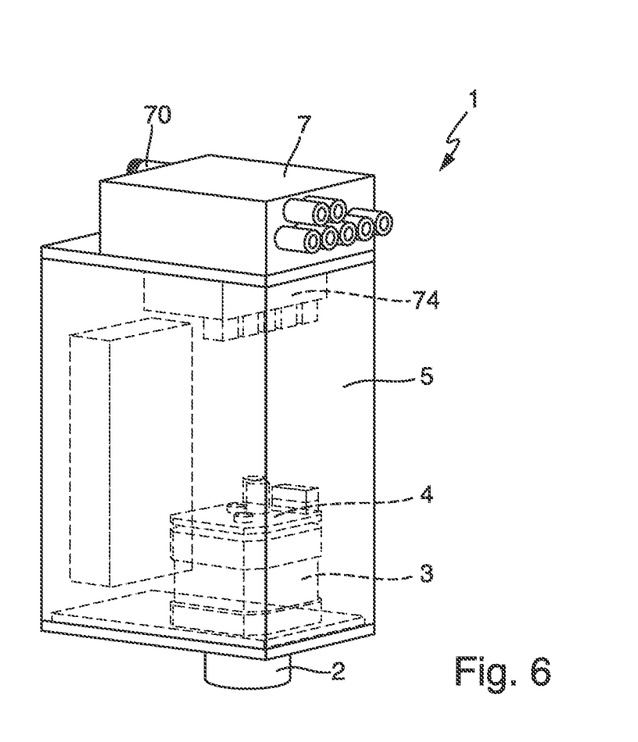
FIG. 6 is the housing from FIG. 5 in a schematic, partly transparent perspective representation.
Figure 7:
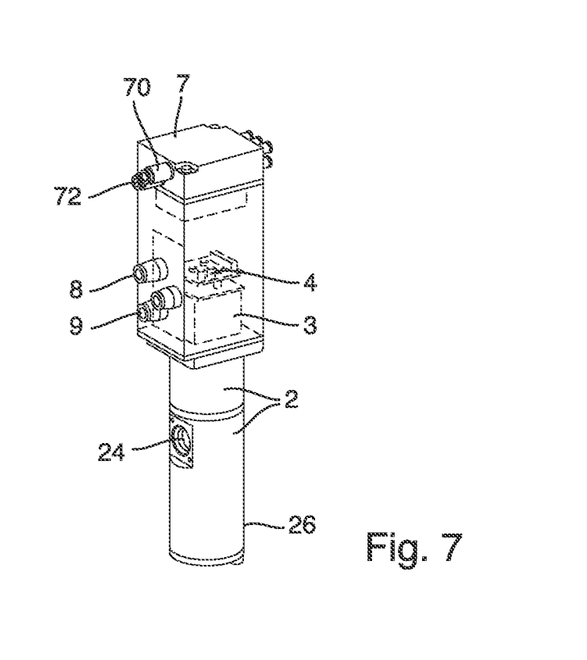
FIG. 7 is a schematic, partly transparent perspective representation of the housing from FIG. 6 in combination with the device for influencing the volume flow.

In FIGS. 6 and 7, the structure described in connection with FIG. 5 is again shown schematically in perspective representations.

The interior sides of the housing 5 can further be provided with a black coating, in order to enable increased heat absorption, and accordingly transportation to the outside of the heat energy that is introduced into the housing.

By improved transfer of the heat generated by the actuator 3 to the wall of the housing 5, it can further be achieved that the heat energy that is introduced into the interior of the housing 5 via the actuator 3 is transported away and radiated away outwards via the housing wall. Improved heat transfer can for example be achieved via direct metallic connections, thermally conductive pads, heat-conducting paste or a suitable indentation in the design of the housing wall in the direction of the actuator 3.

The heat energy that is introduced by the actuator 3 can further be reduced in that the actuator is controlled on the basis of the torque that is actually required, since the bellows 28 are usually less stiff at higher temperatures and thus a correspondingly lower torque is required, with the result that the actuator 3 can then be driven with less energy, and accordingly introduces less heat into the interior of the housing 5.

To the extent applicable, all individual features that are described in the individual example embodiments can be combined with each other and/or exchanged, without departing from the field of the invention.

The invention claimed is:

1. A device for influencing the volume flow of a filling product in a filling plant, comprising:
   a valve body with a valve seat and a valve cone displaceable relative to the valve seat;
   an actuator configured to position the valve cone relative to the valve seat;
   an electronic controller configured to control the actuator;
   a housing that is connected to the valve body and in which the actuator and the electronic controller are disposed; and
   an arrangement that enables reducing a heat input into the electronic controller, wherein the arrangement comprises cooling ribs formed at an end of the valve body that faces towards the housing.

2. The device of claim 1, wherein the cooling ribs comprise rounded edges.

3. The device of claim 1, wherein the arrangement further comprises a pneumatic air supply line configured to introduce pneumatic air into the housing.

4. The device of claim 3, wherein the pneumatic air supply line comprises an expansion valve, a throttle valve or an aperture with a cross section configured to feed expanded pneumatic air into the housing.

5. The device of claim 3, wherein the pneumatic air supply line is arranged such that a flow of pneumatic air escaping from the pneumatic air supply line impinges upon the electronic controller.

6. The device of claim 3, further comprising:
   a control valve configured to regulate a supply of pneumatic air via the pneumatic air supply line; and
   a temperature sensor provided in the housing.

7. The device of claim 1, wherein the housing comprises an air outlet.

8. The device of claim 7, wherein the air outlet comprises a non-return valve.

9. The device of claim 1, wherein the housing comprises a valve block.

10. The device of claim 9, wherein the valve block comprises a pilot valve.

11. The device of claim 10, wherein the housing accommodates an actuator of the pilot valve.

12. The device of claim 10, wherein the valve block is configured such that used pneumatic air from the pilot valve is conducted into the housing.

13. The device of claim 9, wherein the valve block forms a wall of the housing and is connected to the housing by a flange provided on the housing.

14. The device of claim 1, further comprising a plurality of sensor interfaces disposed on the housing, wherein the plurality of sensor interfaces are configured to connect one or more of a flow meter, a weighing cell, or a short-circuit sensor.

15. The device of claim 14, further comprising sensor electronics accommodated in the housing.

16. A device for influencing the volume flow of a filling product in a filling plant, comprising:
   a valve body with a valve seat and a valve cone displaceable relative to the valve seat;
   an actuator configured to position the valve cone relative to the valve seat;
   an electronic controller configured to control the actuator;
   a housing that is connected to the valve body and in which the actuator and the electronic controller are disposed; and
   cooling ribs disposed between the housing and the valve body and formed at an end of the valve body that faces toward the housing.

17. The device of claim 16, wherein the cooling ribs comprise rounded edges.

18. The device of claim 16, wherein the housing comprises an air outlet.

19. The device of claim 16, further comprising a pneumatic air supply line disposed on the housing that is configured to introduce pneumatic air into the housing.

20. The device of claim 19, wherein the pneumatic air supply line is arranged such that a flow of pneumatic air escaping from the pneumatic air supply line impinges upon the electronic controller.

* * * * *